(12) United States Patent
Hsu et al.

(10) Patent No.: US 11,527,382 B2
(45) Date of Patent: *Dec. 13, 2022

(54) ION IMPLANTATION GAS SUPPLY SYSTEM

(71) Applicant: Taiwan Semiconductor Manufacturing Co., Ltd., Hsinchu (TW)

(72) Inventors: Hsing-Piao Hsu, Taoyuan (TW); Nai-Han Cheng, Hsinchu County (TW); Ping-Chih Ou, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/356,100

(22) Filed: Jun. 23, 2021

(65) Prior Publication Data

US 2021/0319978 A1 Oct. 14, 2021

Related U.S. Application Data

(63) Continuation of application No. 16/442,088, filed on Jun. 14, 2019, now Pat. No. 11,081,315.

(51) Int. Cl.
*H01J 37/317* (2006.01)
*C23C 14/48* (2006.01)
*H01J 37/08* (2006.01)
*F17C 13/04* (2006.01)

(52) U.S. Cl.
CPC .......... *H01J 37/3171* (2013.01); *C23C 14/48* (2013.01); *H01J 37/08* (2013.01); *F17C 13/04* (2013.01)

(58) Field of Classification Search
CPC .. H01J 37/3171; H01J 37/08; H01J 2237/006; H01J 2237/31705; H01J 2237/31701; C23C 14/48; C23C 14/564; F17C 13/04; Y02E 60/32; H01L 21/67011
USPC ..................................................... 315/111.81
See application file for complete search history.

(56) References Cited

U.S. PATENT DOCUMENTS

| | | | |
|---|---|---|---|
| 2008/0223409 A1* | 9/2008 | Horsky | H01J 37/304 134/166 R |
| 2010/0162752 A1 | 7/2010 | Tabata et al. | |
| 2013/0104996 A1 | 5/2013 | Oh et al. | |
| 2013/0119252 A1 | 5/2013 | Kawanami et al. | |
| 2017/0362723 A1 | 12/2017 | Jung et al. | |
| 2020/0350139 A1* | 11/2020 | Ferrara | H01J 37/3171 |

* cited by examiner

*Primary Examiner* — Srinivas Sathiraju
(74) *Attorney, Agent, or Firm* — Sterne, Kessler, Goldstein & Fox P.L.L.C.

(57) ABSTRACT

The present disclosure describes a system and a method for providing a mixed gas to an ion implantation tool. The system includes a water supply, an electrical source, a gas generator. The gas generator is configured to generate a first gas from the water supply and the electrical source. The system also includes a first flow controller configured to control a first flow rate of the first gas, a gas container to provide a second gas, a second flow controller configured to control a second flow rate of the second gas, and a gas pipe configured to mix the first and second gases into a mixed gas. The mixed gas can be delivered to, for example, an ion source head of the ion implantation tool.

20 Claims, 4 Drawing Sheets

ION IMPLANTATION GAS SUPPLY SYSTEM

CROSS-REFERENCE TO RELATED APPLICATIONS

This application is a continuation application of U.S. patent application Ser. No. 16/442,088, filed on Jun. 14, 2019, titled "Ion Implantation Gas Supply System," which is incorporated herein by reference in its entirety.

BACKGROUND

Ion implantation (IMP) is widely used in semiconductor fabrication for creating regions of various dopant concentrations/levels. In an IMP process, ions are accelerated to bombard a solid target (e.g., substrate or film), thereby changing the properties (e.g., physical, chemical, and/or electrical properties) of the target. For example, in a complementary metal-oxide semiconductor (CMOS) device, regions of different dopant concentrations can be formed by IMP. A gas supply system of an IMP tool provides the gas sources for the ions.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
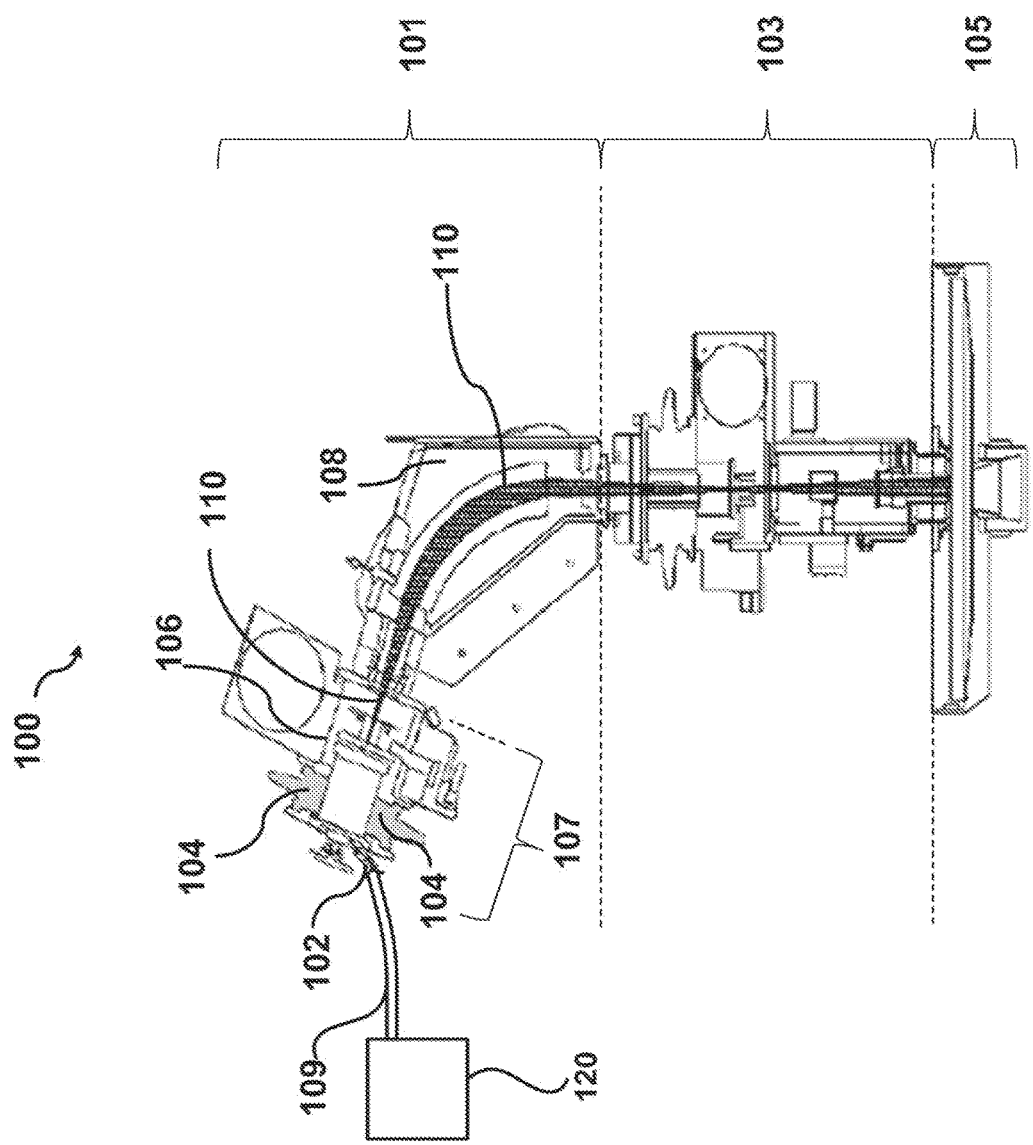
FIG. 1 illustrates an ion implantation apparatus with a gas supply system, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

Ion implantation is widely used in semiconductor fabrication to form regions doped with desired ions (in a device or structure) to alter the chemical, physical, and/or electrical properties of the regions. An ion implantation ("IMP") system is a semiconductor fabrication apparatus used to implant one or more dopant elements into a semiconductor wafer to form doped regions at desired depths in the semiconductor wafer. The dopant elements are introduced into the semiconductor wafer with an ion beam generated and controlled by the IMP. To produce the ion beam, an implant gas or feed material with the desired dopant material is introduced into an ion source, where a high energy is applied to ionize the gas or feed material to form the ion beam. An accelerating electric field is provided by IMP electrodes to extract and direct the ion beam moving toward the semiconductor wafer.

In an IMP process, accelerated ions impinge a region of the substrate of the semiconductor wafer so these ions can be implanted into the substrate as dopants at desired locations/depths. These dopants can enable the device or structure to have desired properties, which are essential for various applications. For example, source and drain regions of a CMOS device are doped with dopants that have an opposite polarity than the substrate and allow the CMOS device to be turned on and off with a gate voltage. The source and drain regions can be formed by performing IMPs on the substrate.

In the IMP process, ions can be accelerated to impinge the semiconductor wafer from various directions, depending on, e.g., the shape and the depth of the doped region. For example, ions can be implanted into the semiconductor wafer at a title angle and a suitable energy so the ions can be implanted within a desired depth/location range. The tilt angle refers to the angle between the direction of the ions and the surface norm of the semiconductor wafer. The tilt angle can be, e.g., about 0 degrees to about 15 degrees. The IMP process can form regions doped with the implanted ions (e.g., dopants). Ideal/theoretical values of parameters, such as ion species, ion energy, ion dosage, and tilt angle, can be provided in a process recipe for the IMP process. These parameters can be used to determine the trajectory of ions when the ions are doped into the semiconductor wafer and to determine the theoretical (e.g., ideal or desired) doping profile (e.g., the point-to-point dopant concentration in the substrate) of the dopants. The dopants can be distributed within a desired depth range into the top surface of the substrate.

Various factors (e.g., atom arrangement, ion species, ion energy, and/or equipment error) can cause the doped ions to change trajectory and the actual doping profile to deviate from the theoretical doping profile. For example, for some atom arrangements, when the actual tilt angle is less than the theoretical tilt angle, ions can be less susceptible to collide with atoms of the substrate and can be implanted deeper into the substrate. Accordingly, the doped region can be more susceptible to a channeling effect, which involves ions penetrating through the substrate/doped region. The channeling effect can cause damage to the doped region or the substrate, thus causing low yield of the fabricated device/structure. For some atom arrangements, when the actual title angle is greater than the theoretical tilt angle, ions are more susceptible to collide with the atoms of the substrate, causing the ions to be ejected from the substrate. As a result, deviation from the theoretical tilt angle can cause a doping profile different than the theoretical doping profile.

During an IMP process, clean gas ions can also be mixed with the implanting ions to remove by-product coating. For example, a boron trifluoride ($BF_3$) gas can be used to implant boron into certain substrate regions of the semiconductor wafer. However, the ion source chamber is usually constructed of a different metal (e.g., tungsten (W)) than the implant gas. And the ionized $BF_3$ implant gas can react with the chamber's metal (e.g., W) to form byproducts (e.g., tungsten hexafluoride ($WF_6$)). The substrate can be exposed to the byproducts, thus degrading device performance. To mitigate the device degradation, a clean gas (e.g., xenon dihydride ($XeH_2$)) can be mixed with the implant gas (e.g., $BF_3$) to generate ionized hydrogen, which is used to remove the byproducts (e.g., $WF_6$).

The implant gas supply and clean gas supply for the ion implanter can be provided by a gas supply system. The gas supply system can use gas containers to supply the gases. These gas containers are required to be changed when empty or after a predetermined period of time, such as three months. To change the gas containers, the ion implanter needs to be shut down, which adversely impacts fabrication time. In addition, as gas containers need to be replaced often (e.g., every three months), the processing cost for a gas supply system with gas containers can be high. Embodiments of the present disclosure, among other things, describe an apparatus, system, and method to provide a continuous gas supply with a gas generator for one or more gases in the ion implanter. Though the following embodiments are described in the context of an ion implanter, the embodiments can be used in other fabrication tools, which are within the scope and spirit of the present disclosure.

FIG. 1 is an isometric view of an IMP apparatus 100 with a gas supply system, according to some embodiments. IMP apparatus 100 can be configured to provide a desired doping type with a desired depth profile on a semiconductor wafer. IMP apparatus 100 can include a gas supply system 120, a source area 101, a beamline area 103, and a process chamber 105, where source area 101 can include a source head device 107 and an atomic mass unit 108, where source head device 107 can be configured to generate and extract an ion beam 110 moving towards atomic mass unit 108 and beamline area 103.

Gas supply system 120 can provide gas sources to source head device 107 through a gas line 109. Various gases can be provided by gas supply system 120, for example, boron trifluoride ($BF_3$), Arsine ($AsH_3$), germanium tetrafluoride ($GeF_4$), silicon tetrafluoride ($SiF_4$), nitrogen ($N_2$), oxygen ($O_2$), carbon dioxide ($CO_2$), hydrogen ($H_2$) or xenon dihydride ($XeH_2$). In some embodiments, the gases can be provided by gas containers and/or gas generators through gas line 109 at a certain flow rate controlled by multiple valves (not shown in FIG. 1 for simplicity).

Source head device 107 can include an ion source 102 and a bushing 104. Source head device 107 can further include conductor components coupling to ion source 102, where the conductor components can include metallic parts in source head device 107, such as a chamber 106. Ion source 102 can be configured to generate an ion species by ionizing an implant gas or feed material. Ion source 102 can be further configured to extract the ion species to generate ion beam 110 moving towards atomic mass unit 108. Depending on the desired doping type on the targeted semiconductor wafer, different chemicals such as $BF_3$, $AsH_3$, $GeF_4$, or $SiF_4$, can be selected as the implant gas or feed material.

Atomic mass unit 108 can be disposed between source head device 107 and beamline area 103. Atomic mass unit 108 can be configured to block a first portion of ion species and allow a second portion of ion species in ion beam 110 to pass to beamline area 103. Atomic mass unit 108 can include a pre-position orifice and a magnet coil (not shown in FIG. 1) to generate a magnetic field, where the magnetic field can exert a specific electromagnetic force for a respective ion species to flow through a corresponding circular path. Since a radius of the corresponding circular path can be determined by a mass of the respective ion species, ion species having substantially the same kinetic energies but different masses can have different corresponding circular paths. Therefore, a pre-position orifice can be disposed within the circular paths to selectively block the first portion of ion species and allow the second portion of ion species to pass to beamline area 103.

Beamline area 103 can be disposed downstream of atomic mass unit 108 and can be configured to accelerate, decelerate, deflect, scan, and shape the filtered ion beam provided by atomic mass unit 108. Beamline area 103 can include electrodes to accelerate or decelerate the filtered ion beams to a different energy. Beamline area 103 can further include lens (not shown in FIG. 1) arranged to control dimensions of the filtered ion beam in orthogonal directions to adjust a cross-section of the filtered ion beam. Beamline area 103 can also include a scanning device (not shown in FIG. 1) to exert electric fields or magnetic fields to allow the filtered ion beam to be scanned two-dimensionally on the targeted semiconductor wafer. As a result, the filtered ion beam passing through beamline area 103 can be applied to irradiate on the target semiconductor wafer at process chamber 105.

In some embodiments, beamline area 103 can be a ballistic drift region for the filtered ion beams. In some embodiments, beamline area 103 can further include a bending magnet (not shown in FIG. 1) to filter neutral particles in the filtered ion beam.

Process chamber 105 can include a holder (not shown in FIG. 1) to hold the targeted semiconductor wafer. The holder can be configured to move the semiconductor wafer two dimensionally relative to the ion beam provided by beamline area 103. The holder can also be configured to allow a single semiconductor wafer to be irradiated by the ion beam serially at a time, or multiple semiconductor wafers simultaneously at a time by repeating a mechanical passage of the multiple semiconductor wafers through the irradiation of the ion beam.

Figure 2:
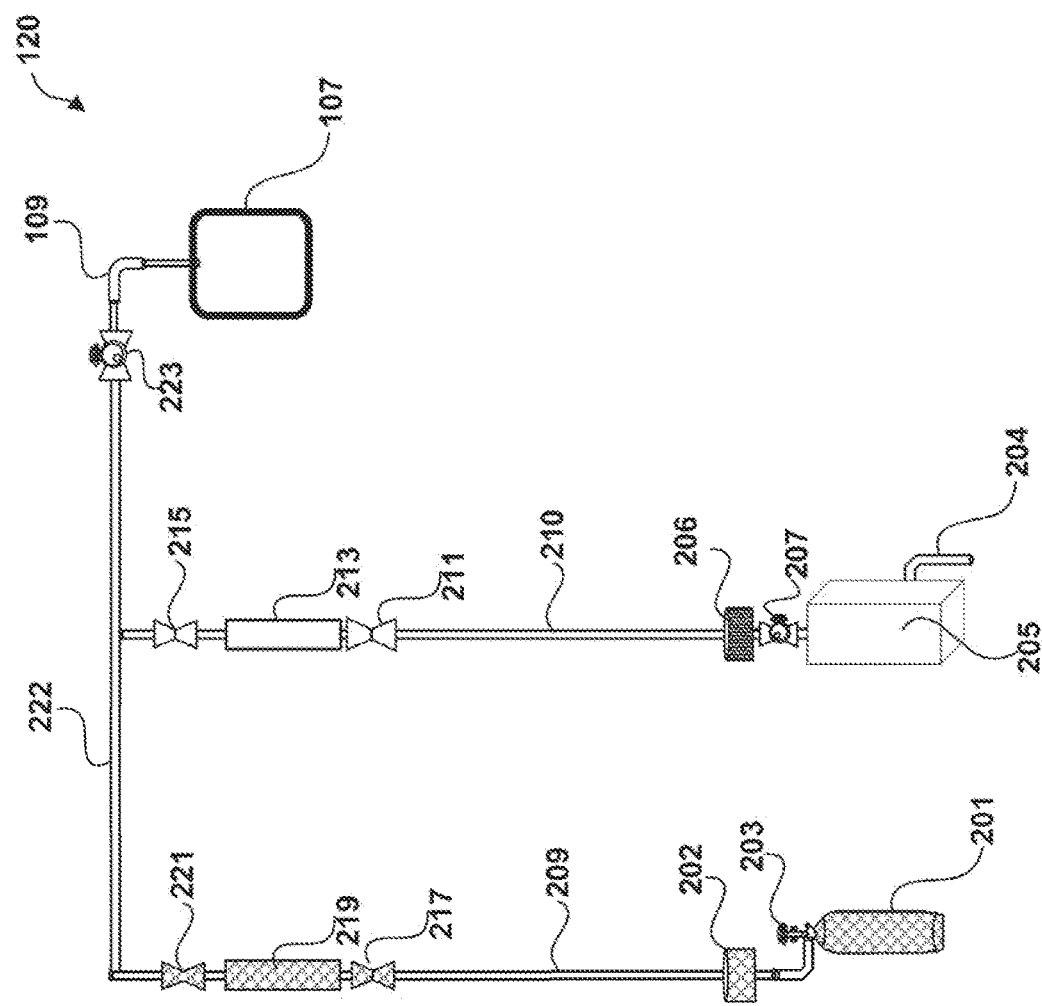
FIG. 2 illustrates a gas supply system with a gas generator for an ion implantation apparatus, according to some embodiments of the present disclosure.

FIG. 2 illustrates an exemplary gas supply system 120 with a clean gas generator for an ion implantation apparatus, according to some embodiments of the present disclosure. Gas supply system 120 includes a gas container 201 with a gas container valve 203, a gas generator 205 with a gas generator piping valve 207 and a water supply 204, gas pressure gauges 202 and 206, gate valves 211, 215, 217, and 221, mass flow controllers (MFC) 213 and 219, gas lines 109, 209, 210, and 222, and a source head valve 223. Though a single gas container and a single gas generator are shown in FIG. 2, based on the present disclosure, multiple gas containers and/or multiple gas generators can be implemented. Such arrangements are within the spirit and scope of the present disclosure.

Gas container 201 can provide a gas, such as $BF_3$, $AsH_3$, $GeF_4$, $SiF_4$, $N_2$, $O_2$, $CO_2$, or $XeH_2$. Gas container valve 203 can control a flow of gas from gas container 201. Gas container valve 203 can be a manually controlled valve (or a computer controlled valve) and can remain open after gas container 201 is fluidly connected to gas line 209. Gas pressure gauge 202 measures a gas pressure in gas container 201. Gate valve 217 can control gas line 209 before the gas reaches mass flow controller 219. Mass flow controller 219 can limit or regulate the flow rate of the gas from gas container 201. Gate valve 221 can control the gas flowing from gas line 209 to gas line 222. Closing of gate valve 221 can prevent other gases in gas line 222 to flow to gas container 201 when the gas in gas container 201 is not in use. In some embodiments, mass flow controller 219 and gate valves 217 and 221 can be controlled by a control unit and can be opened and closed at the same time (or at different times) when providing the gas from gas container 201.

In accordance with some embodiments of the present disclosure, gas container 201 can provide $BF_3$ to ion source head device 107. The flow rate of $BF_3$ can be in a range from 0 to about 5 cubic centimeter per minute. In some embodiments, the flow rate of $BF_3$ can be in a range, for example, from about 0.5 to about 4 cubic centimeter per minute, about 1 to about 3 cubic centimeter per minute, or about 1 to about 2.5 cubic centimeter per minute. The flow rate of the gas from gas container 201 is controlled by mass flow controller 219 and gate valves 217 and 221. After the $BF_3$ gas is ionized, boron ions from the ionized gas can be implanted into certain regions of the semiconductor wafer. However, fluorine ions generated from ionization of the $BF_3$ gas can react with the chamber metal from ion source head device to form a $WF_6$ byproduct, which could coat the semiconductor wafer and lead to degraded device performance.

Referring to FIG. 2, gas generator 205 can generate one or more gases for gas supply system 120, such as $H_2$ or $O_2$, according to some embodiments of the present disclosure. The one or more gases can be generated from an electrical source and a water source from water supply 204. The generated gas can be controlled by gas generator piping valve 207. The pressure of the generated gas from gas generator 205 can be measured by pressure gauge 206. Gate valve 211 can control gas line 210 before the generated gas reaches mass flow controller 213. Mass flow controller 213 can limit or regulate the flow rate of the generated gas from gas generator 205. Gate valve 215 can control the generated gas flowing from gas line 210 to gas line 222. Closing of gate valve 215 can prevent other gases in gas line 222 to flow to gas generator 205 when the gas in gas generator 205 is not in use. Mass flow controller 213 and gate valves 211 and 215 can be controlled by a control unit, such as a computer, and can be opened and closed at the same time (or at different times) when providing the gas from gas generator 205.

In accordance with some embodiments of the present disclosure, gas generator 205 can generate clean gas $H_2$ from water supply 204 for ion source head device 107. The flow rate of $H_2$ can be in a range from 0 to about 5 cubic centimeter per minute. In some embodiments, the flow rate of $H_2$ can be in a range, for instance, from about 0.01 to about 1 cubic centimeter per minute, about 0.05 to about 0.8 cubic centimeter per minute, or about 0.1 to about 0.5 cubic centimeter per minute. The flow rate of the generated gas from gas generator 205 is controlled by mass flow controller 213 and gate valves 211 and 215. Generated $H_2$ can be mixed with $BF_3$ in gas line 222. The mixed gas can be provided to ion source head device 107 for ionization, in which the ionized hydrogen can be used to remove $WF_6$ byproduct through following chemical reactions:

$$BF_3 \rightarrow B^+ + BF^+ + BF^{2+} + F^+.$$

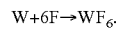

$$W + 6F \rightarrow WF_6.$$

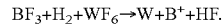

$$BF_3 + H_2 + WF_6 \rightarrow W + B^+ + HF.$$

The generated W can be redeposited in ion source chamber instead of coating on the semiconductor wafer, thus removing $WF_6$ byproduct. The generated hydrogen fluoride (HF) gas can be removed from the tool through an exhaust or vacuum system. And the ionized $B^+$ can be implanted to the semiconductor device.

Gas generator 205 can also generate $O_2$ from water supply 204 for ion source head device 107, in accordance with some embodiments of the present disclosure. The generated $O_2$ can be ionized for an IMP process. In accordance with some embodiments of the present disclosure, another gas generator can be fluidly connected to gas line 222 and can generate one or more other gases from an air supply. The one or more other gases generated from the air supply can include $N_2$, $O_2$, $CO_2$, or other gases, in accordance with some embodiments of the present disclosure. The generated $N_2$, $O_2$, or $CO_2$ gas can also be ionized for the IMP process.

In accordance with some embodiments of the present disclosure, the gas from gas container 201 and the generated gas from gas generator 205 can be mixed in gas line 222 when mass flow controllers 213 and 219 and gate valves 211, 215, 217, and 221 are open. The ratio of the gases from gas container 201 and gas generator 205 can be determined by the flow rates of the gases, which are controlled by mass flow controller 213 and 219, respectively. In some embodiments, the ratio of the mixed gases from gas container 201 and gas generator 205 can be from about 1 to about 100, about 1.5 to about 50, or about 2 to about 25. The mixed gas can be controlled by a source head valve 223 and provided to source head device 107 through pipe line 109. Source head valve can be a manually controlled valve (or a computer controlled valve) and can remain open during the IMP process. In accordance with some other embodiments of the present disclosure, for another IMP process, gas line 222 can include gas from gas generator 205 and no gas from gas container 201.

In accordance with some embodiments of the present disclosure, source head device 107 can maintain a pressure from about $1 \times 10^7$ Torr to about $1 \times 10^5$ Torr. In some embodiments, source head device 107 can maintain a pressure, for example, from about $5 \times 10^7$ Torr to about $8 \times 10^6$ Torr, about $1 \times 10^6$ Torr, or about $3 \times 10^6$ Torr to about $5 \times 10^6$ Torr. The pressures in gas container 201 and gas generator 205 can be higher than the pressure in source head device 107; so when valves 207, 211, 213, 215, and 223 are open, the generated gas can flow from gas generator 205 to source head device 107 through gas line 210 and 222. Similarly, when valves 203, 217, 219, 221 and 223 are open, the gas can flow from gas container 201 to source head device 107.

In accordance with some embodiments of the present disclosure, gas container 201 can be replaced after a predetermined period of time (e.g., about three months) or when gas container 201 is empty. IMP apparatus 100 may need to shut down during gas container replacement, which could reduce the IMP tool processing time. Gas generator 205 can continuously generate gas with continuous water supply. The generated gas can be provided continuously until maintenance of gas generator 205 after a predetermined period of time for maintenance (e.g., about two years). Gas generator 205 can reduce shutting down IMP apparatus 100 and thus improve IMP tool processing time. For example, gas supply system 120 can supply gases by gas container 201 and gas generator 205. Compared to supplying gases with two gas containers, gas supply system 120 can reduce about half of the gas container replacement time/tool shutting down time, as these two gas containers may not be changed at the same time. In another example, gas supply system 120 can supply a gas from gas generator 205 and no gas from gas container 201. In this case, there is no need for gas container replacement and/or the tool shutting down every three months. Maintenance of gas generator 205 is needed, for example, about every two years. In addition, as gas containers need to be replaced more often and the cost of gas containers is high, using gas generated from gas generators can reduce processing cost.

Gas supply system 120 can further include an emergency shutdown (not shown in FIG. 2). In some embodiments of the present disclosure, when a gas leakage, power outage, power supply problem, or other emergency situation occurs, the emergency shutdown can close all the valves in gas supply system 120 and shut down the IMP tool to prevent damaging the tool.

Gas supply system 120 can further include an inert gas supply and a purging system (not shown in FIG. 2). The inert gas can be argon, helium, or other inert gas. The purging system can purge the gas lines with the inert gas during gas container replacement and/or gas generator maintenance, thus preventing contamination in gas supply system during the replacement and/or maintenance processes.

Figure 3:
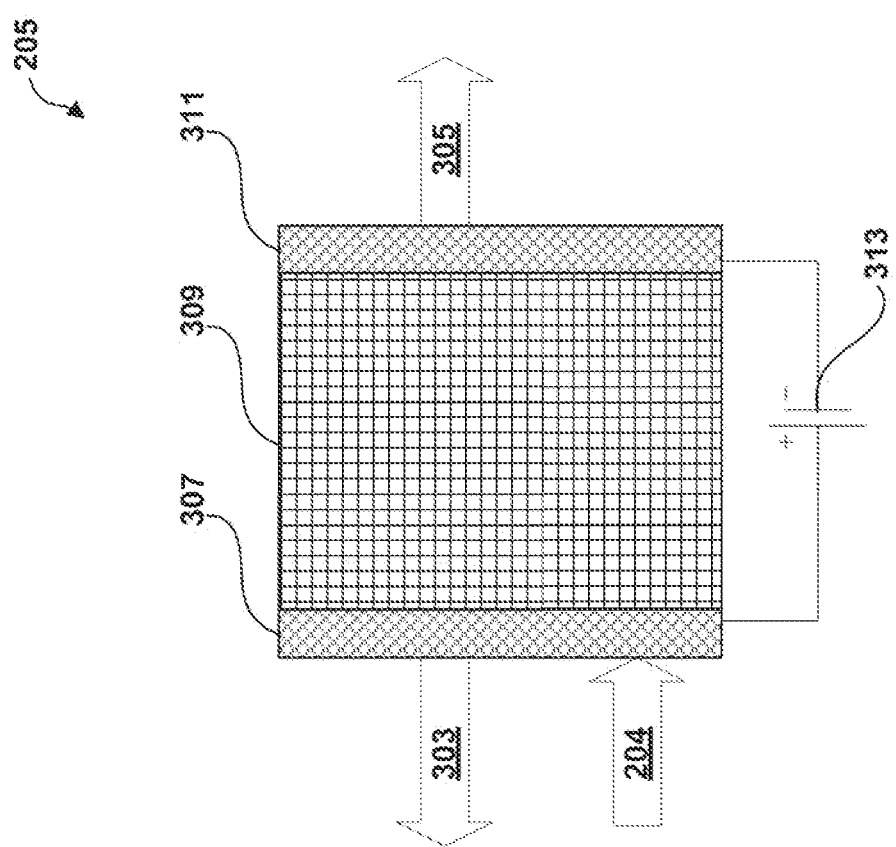
FIG. 3 illustrates a clean gas generator for a gas supply system, according to some embodiments of the present disclosure.

FIG. 3 illustrates a gas generator 205 for gas supply system 120, according to some embodiments of the present disclosure. Gas generator 205 can include water supply 204, an oxygen gas outlet 303, a hydrogen gas outlet 305, an oxygen electrode 307, a proton exchange membrane (PEM) 309, a hydrogen electrode 311, and an electrical source 313. Gas generator 205 can use deionized (DI) water from water supply 204 and electrical source 313 to generate oxygen and hydrogen gases for gas supply system 120.

In accordance with some embodiments of the present disclosure, gas generator 205 can use a platinum catalyst and PEM technology to split the DI water into oxygen and hydrogen ions. PEM 309 can allow water and positive ions to cross between oxygen electrode 307 and hydrogen electrode 311. PEM 309 can also serve as an electrolyte in gas generator 205, instead of hazardous liquid electrolytes such as concentrated potassium hydroxide. PEM water electrolysis can split DI water into oxygen that flows through oxygen gas outlet 303 and hydrogen that flows through hydrogen gas outlet 305.

Electrical source 313 can be a direct current (DC) electrical source applied to oxygen electrode 307 and hydrogen electrode 311. Oxygen electrode 307 can be a positive electrode (or anode), and hydrogen electrode 311 can be a negative electrode (or cathode). The DI water from water supply 204 can be provided to oxygen electrode 307, in which the DI water is oxidized to oxygen gas and hydrogen ions ($H^+$), while electrons ($e^-$) are released through this chemical reaction:

The hydrogen ions can pass through PEM 309 to the hydrogen electrode, where the hydrogen ions can meet electrons from the cathode of electrical source 313 and reduce to hydrogen gas through this chemical reaction:

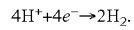

In accordance with some embodiments of the present disclosure, gas generator 205 can be a safe, convenient and cost-effective alternative to high pressure gas containers. Gas generator 205 can produce gases on demand at a regulated flow (e.g., 0.5 liter per minute) and pressure (e.g., 120 pound per square inch), as compared to gas containers storing up to thousands of liters (e.g., 9,000 liters) of gases at high pressure (e.g., 3,000 pound per square inch). High pressure compressed gas can be toxic, flammable, oxidizing, corrosive, and/or inert. In the event of a leak, large amount of gases can quickly displace air in a large area, creating poison atmospheres, fire and exploding gas containers, and/or an oxygen deficient atmosphere. Regulated gas flow and lower gas pressure of gas generator 205 can reduce these hazarders. With continuous power supply from electrical source 313 and deionized water supply from water supply 204, gas generator 205 can continuously provide hydrogen and oxygen gases, thus resulting in less maintenance over time (e.g., about every two years) as compared to gases provided by gas containers (e.g., about every three months).

Figure 4:
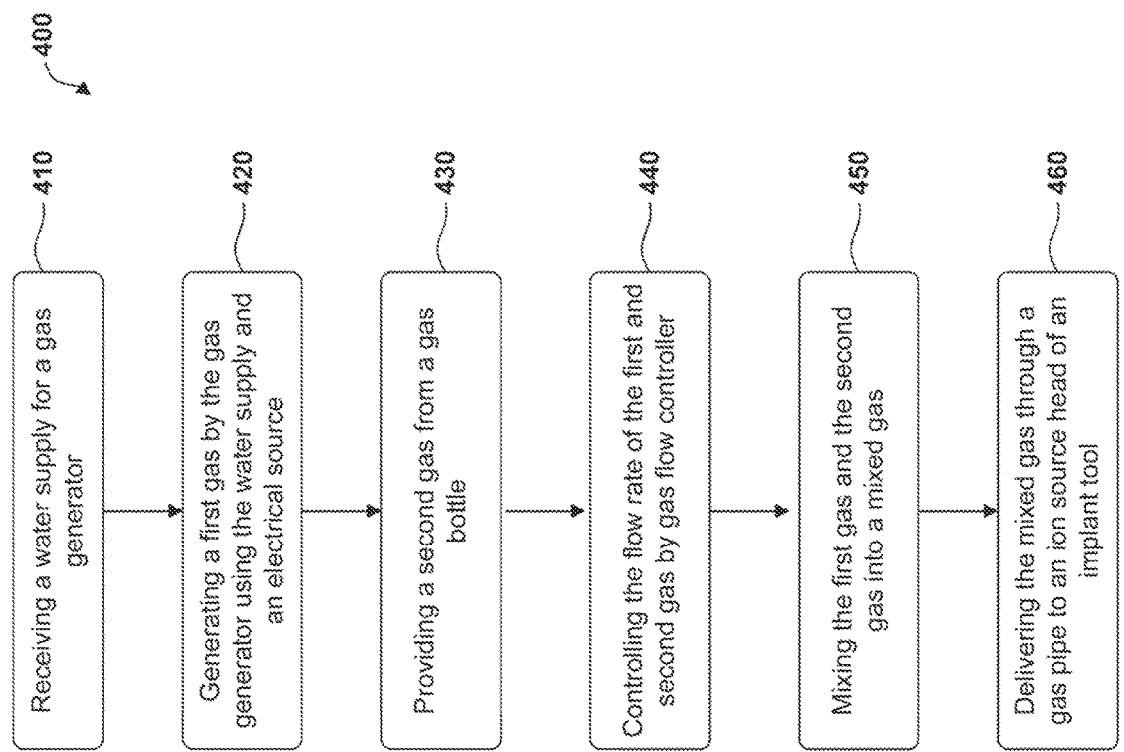
FIG. 4 illustrates a method for providing a mixed gas for an ion implantation apparatus, according to some embodiments of the present disclosure.

FIG. 4 illustrates an exemplary method 400 for providing a mixed gas for an IMP apparatus, according to some embodiments of the present disclosure. This disclosure is not limited to this operational description. It is to be appreciated that additional operations may be performed. Moreover, not all operations may be needed to perform the disclosure provided herein. Further, some of the operations may be performed simultaneously, or in a different order than shown in FIG. 4. Operations of method 400 can be performed by, for example, gas supply system 120 of FIGS. 1-3. Operations of method 400 can also be performed by other embodiments discussed in this disclosure. In some implementations, one or more other operations may be performed in addition to or in place of the presently described operations.

At operation 410 of FIG. 4, a gas supply system can receive a water supply for a gas generator. According to some embodiments of the present disclosure, the water supply can provide continuous deionized (DI) water to the gas generator. Referring to FIG. 2, the DI water can be supplied through water supply 204 to gas generator 205. According to some other embodiments of the present disclosure, the gas supply system can also receive an air supply for gas generator 205.

At operation 420 of FIG. 4, the gas generator can generate a first gas using the water supply and an electrical source. According to some embodiments of the present disclosure, the gas generator can use PEM technology to split DI water into oxygen gas and hydrogen gas. Referring to FIG. 3, the first gas can be hydrogen and can be generated at hydrogen electrode 311 of gas generator 205. According to some other embodiments of the present disclosure, the gas generator can also generate a first gas using an air supply.

At operation 430 of FIG. 4, the gas supply system can provide a second gas from a gas container. According to some embodiments of the present disclosure, referring to FIG. 2, the second gas can be $BF_3$ and can be provided from gas container 201 of gas supply system 120.

At operation 440 of FIG. 4, the gas supply system can control the flow rate of the first and second gases by respective gas flow controllers. According to some embodiments of the present disclosure, referring to FIG. 2, the flow rate of the first gas can be controlled by mass flow controller 213, and the flow rate of the second gas can be controlled by mass flow controller 219.

At operation 450 of FIG. 4, the gas supply system can mix the first gas and the second gas into a mixed gas. According to some embodiments of the present disclosure, referring to FIG. 2, the first gas from gas generator 205 and the second gas from gas container 201 can be mixed in gas line 222 into a mixed gas. The ratio between the first gas and the second gas in the mixed gas can be determined by their flow rate. In some embodiments, the ratio of the mixed gases from gas container 201 and gas generator 205 can be from about 1 to about 100, about 1.5 to about 50, or about 2 to about 25.

At operation 460 of FIG. 4, the gas supply system can deliver the mixed gas through a gas pipe to an ion source head of an implantation tool. According to some embodiments of the present disclosure, referring to FIG. 2, the mixed gas can be delivered through gas pipe 109 to ion source head device 107. The mixed gas can be ionized in source head device 107 and used for an IMP process and/or clean IMP byproducts.

In accordance with some embodiments of the present disclosure, an apparatus, system, and method are described to provide a continuous gas supply by a gas generator for one or more gases in an IMP system. The gas generator can be a safe, convenient, and cost-effective alternative to high pressure gas containers, and it can continuously provide gases to the IMP system, thus resulting in less maintenance over time (e.g., about every two years) as compared to gases provided by gas containers (e.g., about every three months). In addition, as gas containers need to be replaced more often and the cost of gas containers is high, using gas generated from gas generators can reduce processing cost.

In some embodiments, a gas supply system includes a water supply, an electrical source, a gas generator configured to generate a first gas from the water supply and the electrical source, a first flow controller configured to control a first flow rate of the first gas, a gas container to provide a second gas, a second flow controller configured to control a second flow rate of the second gas, and a gas pipe configured to mix the first and the second gas into a mixed gas.

In some embodiments, a method for providing a mixed gas to an implantation tool includes receiving a water supply, generating, by a gas generator, a first gas using the water supply and an electrical source, controlling the first gas by a first flow controller, providing, from a gas container, a second gas, controlling the second gas by a second flow controller, mixing the first gas and the second gas into a mixed gas, and delivering the mixed gas through a gas pipe to an ion source head of the implantation tool.

In some embodiments, an ion implantation system includes an ion source head configured to extract an ion beam, and a gas supply system configured to provide a mixed gas to the ion source head, which includes a water supply, an electrical source, a gas generator configured to generate a first gas from the water supply and the electrical source, a first flow controller configured to control a first flow rate of the first gas, a gas container to provide a second gas, a second flow controller configured to control a second flow rate of the second gas, and a gas pipe configured to mix the first and the second gases into the mixed gas and deliver the mixed gas to the ion source head.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A system, comprising:
   a first flow controller configured to control a first flow rate of a first gas provided by a generator configured to continuously generate the first gas for a period of time greater than that of a first gas container with a first predetermined storage capacity;
   a second flow controller configured to control a second flow rate of a second gas provided by a second gas container with a second predetermined storage capacity; and
   a gas pipe configured to mix the first gas and the second gas into a mixed gas.

2. The system of claim 1, further comprising a plurality of valves to control the first and second flow rates of the first and second gases, respectively, in the gas pipe.

3. The system of claim 1, further comprising a gate valve connected to the first flow controller, an additional gas pipe connected to the gate valve, a gas pressure gauge connected to the additional gas pipe, and a gas piping valve connected to the generator to control the first flow rate of the first gas.

4. The system of claim 1, wherein the first gas comprises at least one of hydrogen, oxygen, nitrogen, and carbon dioxide.

5. The system of claim 1, wherein the first gas is generated from a water supply provided by the generator.

6. The system of claim 1, wherein the first gas is generated from an air supply provided by the generator.

7. The system of claim 1, further comprising another generator configured to continuously generate a third gas for a period of time greater than that of a third gas container with a third predetermined storage capacity.

8. A method, comprising:
   continuously generating, by a gas generator, a first gas for a period of time greater than that of a first gas container with a first predetermined storage capacity;
   controlling a first flow rate of the first gas by a first flow controller connected to the gas generator through at least one valve;
   providing a second gas from a second gas container with a second predetermined storage capacity;
   controlling a second flow rate of the second gas by a second flow controller; and
   mixing the first gas and the second gas into a mixed gas.

9. The method of claim 8, further comprising controlling the first and second flow rates of the first and second gases, respectively, in a gas pipe by a plurality of gate valves.

10. The method of claim 8, further comprising controlling the first flow rate of the first gas through a gate valve connected to the first flow controller, a gas pipe connected to the gate valve, a gas pressure gauge connected to the gas pipe, and a gas piping valve connected to the gas generator.

11. The method of claim 8, further comprising delivering the mixed gas through a gas pipe to an ion source head of an implantation tool.

12. The method of claim 8, wherein continuously generating the first gas comprises generating at least one of hydrogen, oxygen, nitrogen, and carbon dioxide.

13. The method of claim 8, wherein continuously generating the first gas comprises generating the first gas from a water supply provided by the gas generator.

14. The method of claim 8, wherein continuously generating the first gas comprises generating the first gas from an air supply provided by the gas generator.

15. The method of claim 8, further comprising continuously generating, by another gas generator, a third gas for a period of time greater than that of a third gas container with a third predetermined storage capacity.

16. An ion implantation system, comprising:
a an ion source head configured to extract an ion beam; and
a gas supply system configured to provide a mixed gas to the ion source head, comprising:
   a first flow controller configured to control a first flow rate of a first gas provided by a gas generator configured to continuously generate the first gas for a period of time greater than that of a first gas container with a first predetermined storage capacity;
   a second flow controller configured to control a second flow rate of a second gas provided by a second gas container with a second predetermined storage capacity; and
   a gas pipe configured to:
      mix the first and the second gases into the mixed gas; and
      deliver the mixed gas to the ion source head.

17. The ion implantation system of claim 16, further comprising a gate valve connected to the first flow controller, an additional gas pipe connected to the gate valve; a gas pressure gauge connected to the additional gas pipe, and a gas piping valve connected to the gas generator to control the first flow rate of the first gas.

18. The ion implantation system of claim 16, wherein the first gas comprises at least one of hydrogen, oxygen, nitrogen, and carbon dioxide.

19. The ion implantation system of claim 16, wherein the first gas is generated from a water supply provided by the gas generator.

20. The ion implantation system of claim 16, wherein the first gas is generated from an air supply provided by the gas generator.

* * * * *

UNITED STATES PATENT AND TRADEMARK OFFICE
CERTIFICATE OF CORRECTION

| | |
|---|---|
| PATENT NO. | : 11,527,382 B2 |
| APPLICATION NO. | : 17/356100 |
| DATED | : December 13, 2022 |
| INVENTOR(S) | : Hsu et al. |

It is certified that error appears in the above-identified patent and that said Letters Patent is hereby corrected as shown below:

In the Claims

In Column 12, Claim 17, Line 15, delete "valve;" and insert -- valve, --, therefor.

Signed and Sealed this
Twenty-first Day of February, 2023

*Katherine Kelly Vidal*

Katherine Kelly Vidal
*Director of the United States Patent and Trademark Office*